US 10,613,492 B2

(12) United States Patent
Baone et al.

(10) Patent No.: US 10,613,492 B2
(45) Date of Patent: Apr. 7, 2020

(54) METHOD AND SYSTEM FOR PROVIDING FLEXIBLE RESERVE POWER FOR POWER GRID

(71) Applicant: General Electric Company, Schenectady, NY (US)

(72) Inventors: Chaitanya Ashok Baone, Glenville, NY (US); Khaled Yehia Bahei-Eldin, Halfmoon, NY (US); Yan Pan, Niskayuna, NY (US); Reza Ghaemi, Watervliet, NY (US); Xing Wang, Rexford, NY (US); Naresh Acharya, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 27 days.

(21) Appl. No.: 15/660,315

(22) Filed: Jul. 26, 2017

(65) Prior Publication Data

US 2019/0033801 A1 Jan. 31, 2019

(51) Int. Cl.
*G05B 15/02* (2006.01)
*G06Q 50/06* (2012.01)
(Continued)

(52) U.S. Cl.
CPC .......... *G05B 15/02* (2013.01); *G01R 23/175* (2013.01); *G05F 1/66* (2013.01); *G06Q 10/08* (2013.01);
(Continued)

(58) Field of Classification Search
CPC ......... G05B 15/02; G01R 23/175; G05F 1/66; G06Q 10/08; G06Q 50/06; H02J 3/14; H02J 3/18; H02J 3/24
(Continued)

(56) References Cited

U.S. PATENT DOCUMENTS 7,844,370 B2 11/2010 Pollack et al.
8,417,391 B1 4/2013 Rombouts et al.
(Continued)

FOREIGN PATENT DOCUMENTS

CN 105071378 A 11/2015
WO 2016/069330 A1 5/2016
WO 2016069330 A1 5/2016

OTHER PUBLICATIONS

Extended European Search Report and Opinion issued in connection with corresponding EP Application No. 18174275.0 dated Sep. 25, 2018.
(Continued)

*Primary Examiner* — Hal Kaplan
(74) *Attorney, Agent, or Firm* — Buckley, Maschoff & Talwalkar LLC

(57) ABSTRACT

An optimization-based method and system is disclosed to enable heterogeneous loads and distributed energy resources (DERs) to participate in grid ancillary services, such as spinning and non-spinning reserves, and ramping reserves. The method includes receiving inputs for decision parameters for optimizing an objective for obtaining flexible reserve power, solving the objective for obtaining flexible reserve power, determining a reserve power schedule for a prediction horizon for providing flexible reserve power based on the objective, generating a service bid based on the reserve power schedule for the power grid; and when the service bid is accepted, providing flexible reserve power to the power grid based on the service bid.

13 Claims, 12 Drawing Sheets

(51) Int. Cl.
*G01R 23/175* (2006.01)
*G05F 1/66* (2006.01)
*G06Q 10/08* (2012.01)
*H02J 3/14* (2006.01)
*H02J 3/18* (2006.01)
*H02J 3/24* (2006.01)

(52) U.S. Cl.
CPC ............... *G06Q 50/06* (2013.01); *H02J 3/14* (2013.01); *H02J 3/18* (2013.01); *H02J 3/24* (2013.01)

(58) Field of Classification Search
USPC .......................................................... 307/64
See application file for complete search history.

(56) References Cited

U.S. PATENT DOCUMENTS

| | | | |
|---|---|---|---|
| 8,428,785 | B2 | 4/2013 | Boucher et al. |
| 9,287,710 | B2 | 3/2016 | Talkin et al. |
| 2011/0022434 | A1 | 1/2011 | Sun et al. |
| 2012/0083930 | A1 | 4/2012 | Ilic et al. |
| 2012/0226384 | A1 | 9/2012 | Forbes, Jr. |
| 2013/0238139 | A1 | 9/2013 | Boucher et al. |
| 2014/0200723 | A1 | 7/2014 | Roy et al. |
| 2014/0277599 | A1 | 9/2014 | Pande et al. |
| 2015/0039145 | A1 | 2/2015 | Yang et al. |
| 2015/0134135 | A1 | 5/2015 | Wong et al. |
| 2015/0295405 | A1 | 10/2015 | Black et al. |
| 2017/0040839 | A1 | 2/2017 | Srivastava et al. |

OTHER PUBLICATIONS

Giuntoli et al., "Optimized Thermal and Electrical Scheduling of a Large Scale Virtual Power Plant in the Presence of Energy Storages", IEEE Transactions on Smart Grid, vol. 4, Issue 2, Jun. 2013, pp. 942-945.

Wang et al., "Dynamic Control and Optimization of Distributed Energy Resources in a Microgrid", IEEE Transactions on Smart Grid, vol. 6, Issue 6, Nov. 2015, pp. 2884-2894.

Soares et al., "A Multi-Objective Model for the Day-Ahead Energy Resource Scheduling of a Smart Grid with High Penetration of Sensitive Loads", Applied Energy, vol. 162, Jan. 15, 2016, pp. 1074-1088.

Marzband et al., "Real Time Experimental Implementation of Optimum Energy Management System in Standalone Microgrid by Using Multi-layer ant Colony Optimization", International Journal of Electrical Power & Energy Systems, vol. 75, Feb. 2016, pp. 264-274.

European Search Report dated Sep. 25, 2018 which was issued in connection with EP18174275.0 which was filed on May 25, 2018.

METHOD AND SYSTEM FOR PROVIDING FLEXIBLE RESERVE POWER FOR POWER GRID

STATEMENT REGARDING FEDERALLY SPONSORED RESEARCH & DEVELOPMENT

This invention was made with Government support under contract number DE-AR0000698 awarded by the Department of Energy. The Government has certain rights in the invention.

BACKGROUND

Embodiments of the present disclosure relate to providing flexible reserve power for the power grid from distributed flexible resources while maintaining economy and stability of power requirement for the distributed flexible resources.

The power grid has several requirements for reserve power which are referred herein as ancillary services, and these include providing spinning reserves and non-spinning reserves, and ramping reserve, that are required to main power grid stability. These ancillary services have traditionally been only provided by conventional power plants. With the integration of renewable generation in the power grid, the requirements of ancillary services are also changing from a fixed demand (that could be met by conventional power plants) for a given time horizon to a flexible demand, due to the unpredictable nature of the renewable generation which needs to be balanced by the ancillary services, for maintaining the stability of the grid, as mentioned herein above.

The distributed flexible resources that include a combination of multiple loads and distributed energy sources have their own power requirements that need to be met. For example, a commercial building may have several loads to maintain a temperature of the building, and may include its own power generation unit (which is referred herein as a distributed energy resource) to support these load requirements.

Methods and systems for providing predictable reserve power from the distributed flexible resources for the power grid face issues related to predicting an economic and reliable solution without compromising the power requirements of these distributed flexible energy resources.

BRIEF DESCRIPTION

In one aspect a method for providing flexible reserve power to a power grid is provided. The method includes a step for receiving a plurality of inputs for a plurality of decision parameters for optimizing an objective for obtaining flexible reserve power. The method then includes a step for solving the objective for obtaining flexible reserve power by processing the plurality of inputs, wherein inputs associated with a plurality of loads and distributed energy resources from the plurality of inputs are aggregated as inputs from a distributed flexible resource. The method then includes a step for determining a reserve power schedule for a prediction horizon for providing flexible reserve power to a power grid based on the objective while maintaining power requirements of the distributed flexible resource. Further steps include generating a service bid based on the reserve power schedule for the power grid; and at least in some implementations when the service bid is accepted, providing flexible reserve power to the power grid based on the service bid.

In another aspect, a system for providing flexible reserve power for a power grid is provided. The system includes a distributed flexible resource with multiple loads and at least one distributed energy resource. The power management unit is configured for controlling the distributed flexible resource and a dual optimizer unit is configured for determining a reserve power schedule for a prediction horizon for providing flexible reserve power to the power grid based on an objective for providing flexible reserve power while maintaining power requirements of the distributed flexible resource. A reserve power provider unit is configured for providing flexible reserve power to the power grid based on the reserve power schedule.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

This disclosure presents an optimization-based approach to enable heterogeneous loads and distributed energy resources (DERs) that are available in infrastructures like commercial buildings to participate in grid ancillary services, such as spinning and non-spinning reserves, and ramping reserves for maintaining grid stability. The method and system described herein determine optimal short term or medium term schedules for multiple loads and DERs for providing the ancillary services and other control and management solutions for loads and sub-stations in a required time horizon, which could be a day-ahead periodicity. It would be appreciated by those skilled in the art that the method and system described herein solve a cost minimization problem with an objective of minimizing the net cost for aggregated distributed flexible resources over a selected time horizon for providing reserve power while staying within individual load quality-of-service constraints that are required for maintaining a standard load fulfilment for the individual loads and power generation requirements for the DERs.

More specifically, the method and system described herein translate the above objective as a model-based optimization problem that accounts for individual load constraints, expected reserve power prices, load forecasts, physics-based dynamic models representing behavior of loads, explicit consideration towards model parameters and disturbance uncertainties and that simultaneously meets multiple grid service objectives.

The 'short term' referred herein is a time period of about up to 30 minutes in one exemplary embodiment, to about up to one hour in another exemplary embodiment, and 'medium term' time period refers to a period of more than one hour to up to 3 hours. Typically, the short term and the medium term are defined by the power grid or based on industry standards, and as such the embodiments of the invention will be applicable to other short terms or medium terms as determined by power grid or industry standards.

The system and method are described herein below in more detail in reference with the drawings.

Figure 1:
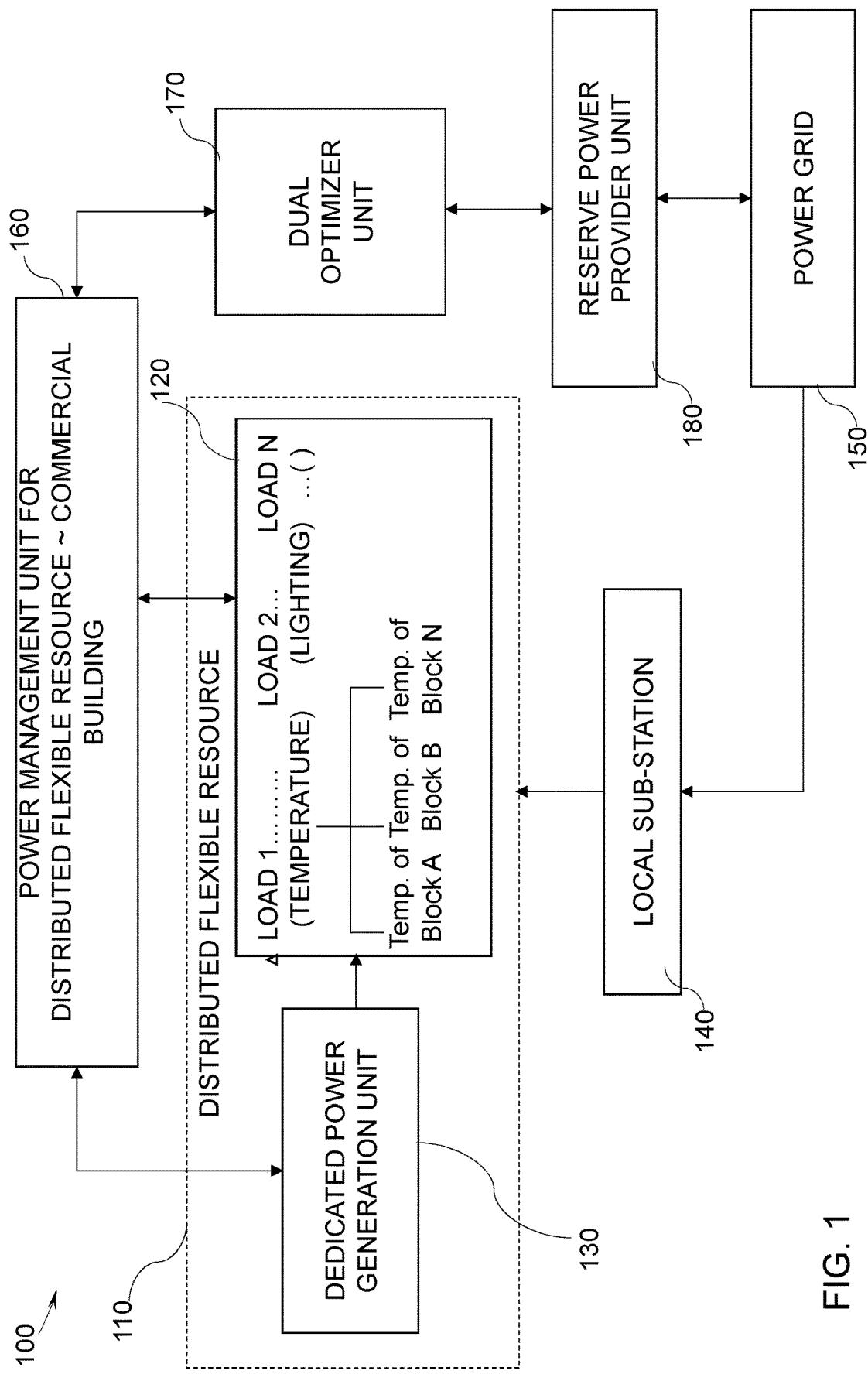
FIG. 1 is a general schematic diagram showing a representation for a system for providing reserve power for a power grid, according to one embodiment.

FIG. 1 is a general schematic showing a representation for a system 100 for providing flexible reserve power for a power grid 150. A distributed flexible resource 110 is shown, which in one example is a commercial building. The distributed flexible resource 110 has different loads represented generally by reference numeral 120 to fulfil different power requirements of different utilities, such as temperature maintenance, lighting, power for different equipment such as computers, refrigerators, etc. shown generally by Load 1, Load 2, . . . Load N. Each load may be further supporting a select power utility function for a specific location, which is shown as for example, temperature of Block A, temperature of Block B, temperature of Block C. That commercial buildings represented herein as the distributed flexible resource 110 may have their own dedicated power generation unit 130, or referred generally as a distributed energy resource 130, that is used to generate power for operating the loads 120, or supplement the power delivered by a local sub-station 140 that is supported by the power grid 150. Also shown in FIG. 1 is a power management unit 160 for the commercial building (distributed energy resource) 120 that is used to control and monitor the power requirements of the loads 120 and the power generation by the dedicated power generation unit 130.

As mentioned herein above, the infrastructure such as commercial building which has its own power generation unit to support the load requirement of the infrastructure, can also be used as the distributed energy resource to provide reserve power to the power grid for power grid stability requirements, specifically for spinning and non-spinning reserves, and ramping reserves. In the description herein, upwards for spinning and non-spinning reserves is termed as category 2 or C2 Up, and downwards spinning or non-spinning reserves is termed as category 2 or C2 Down, and ramping reserves are termed as Category 3, or C3 reserves.

A dual optimizer unit 170 is used to provide an optimal solution that is able to contribute to reserve power requirement of the power grid, while maintaining a threshold level of load requirements of the infrastructure that is being used as the distributed flexible resource, such as the commercial building in FIG. 1. The method employed for achieving the optimal solution is described herein below in more detail. The dual optimizer unit 170 is communicatively linked to both the power management unit 160 and to a reserve power provider unit 180. It would be appreciated by those skilled in the art that the reserve power provider unit 180 will sometimes reside with a server of an agency that provides reserve power. It may be noted here that the reserve power provider unit 180 may have some constraints and objectives for providing reserve power, and these are communicated to the dual optimizer unit 170. The dual optimizer unit 170 receives the different inputs related to the status of different loads, load behavior, status of the dedicated power generation unit and other related information pertaining to the loads and the dedicated power generation unit from the power management unit 160. The dual optimizer unit 170 and the method for providing reserve power while maintaining the requirements of the infrastructure being used as the distributed energy resource are described in more detail herein below.

The dual optimizer unit 170 in some implementations can be a part of the reserve power provider unit 180, or, in another example, be a part of one of the controllers used for management of the power grid. In these implementations the dual optimizer unit may share the server or have a dedicated server for executing different functions and storing relevant data. In some implementations, the dual optimizer unit can be stand alone unit implemented through a dedicated server.

In all implementations, the system 100 is implemented at least in part through processors and memory through programmed integrated chip circuitry. Further, each of the components or at least some of the components of system 100, described in FIG. 1, include user interfaces that allow a user or operator to provide user inputs that may be related to control and monitoring of the specific functions of the components.

Figure 2:
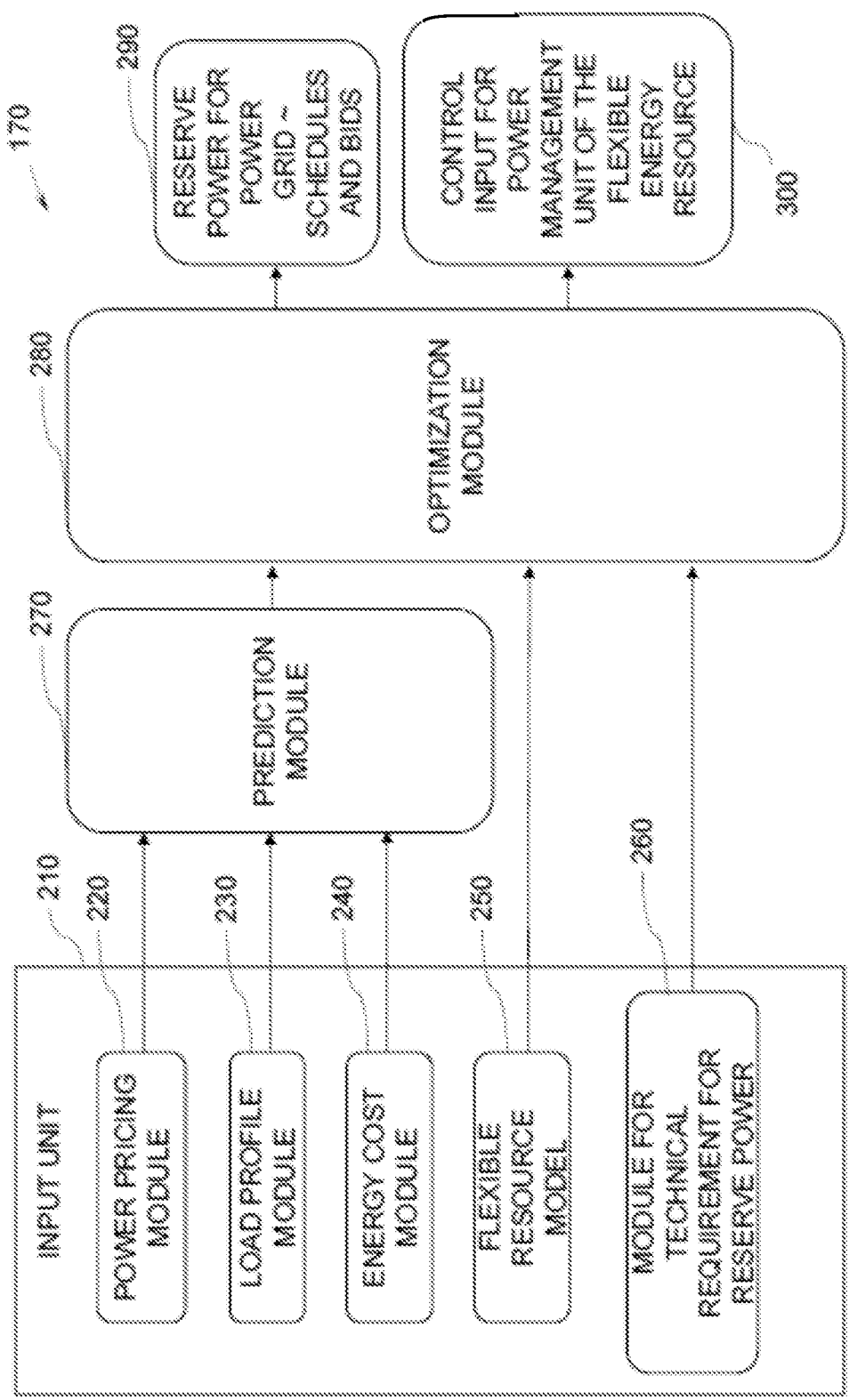
FIG. 2 is a block diagram representation of a dual optimizer unit used in the system of FIG. 1.

Now turning to FIG. 2, a block diagram representation of the dual optimizer unit 170 is shown in more detail. An input unit 210 is provided which includes different modules such as a power pricing module 220 that provides historical data over a given time period for pricing in terms of price in unit currency per Mega Watts (MW), for example US dollar per MW, for each reserve power category, for example for C2 Up price, C2 Down price, and C3 price.

The input unit 210 further includes a load profile module 230 that provides historical data over a given period of time for different loads and distributed energy resources (DERs) in an aggregated form as load profiles in Mega Watt with respect to time. Thus the distributed flexible resources (loads and DERs) are represented as controllable assets through aggregation.

The input unit 210 further includes an energy cost module 240 that provides a schedule (usually a fixed schedule) of energy cost in unit currency per Mega Watt hour (MWh) that is decided by the power grid authority or other agency authorized for deciding the energy costs.

The input unit 210 further includes a flexible resource model 250 that provides inputs on load behavior and behavior of distributed energy resources based on physics based modelling of loads and the distributed energy resources. The flexible resource model provides a predicted behavior for the loads and the distributed energy resources based on historical data and physics based modelling for a given prediction horizon or time cycle and time frequency that may be user determined.

The input unit 210 further includes a module that is referred by reference numeral 260 for transmitting technical requirements that are required for category 2 and category 3 reserves, the technical requirements are provided by the power grid in some implementations or by any other agency authorized to communicate the technical requirements.

As shown in FIG. 2 the inputs related to power pricing, load profiles, and energy costs are sent to a prediction module 270 that uses the inputs of historical data for a given time period for these parameters and generates prediction for each of these for a 24 hour prediction horizon or time cycle in one example, with a frequency of one hour predictions (in some implementations the frequency could be user defined, for example it is 30 minutes in another implementation). The time cycle could be user defined in some implementations, and it could be less than prediction horizon i.e. 24 hour time cycle in some implementations.

The optimization module 280 receives the predicted values for a given prediction horizon or time cycle and time frequency for different parameters-pricing, load profiles, energy costs, along with the load and distributed energy resource behavior predictions and technical requirements, as described herein above. The optimization module 280 uses these inputs to define an optimization problem and solves the same within the given constrains as described herein below, and provides a schedule and a bid for the reserve power for power grid that is shown by reference numeral 290 that is sent to the reserve power provider unit as described in FIG. 1 and is further implemented by the power grid at least in some instances. The optimization module 280 further provides a control input 300 for a power management unit shown in FIG. 1 for adjusting power supply to any of the loads or for any other load management function.

Thus, the dual optimizer unit 170 advantageously operates to provide reserve power to the power grid while maintaining the power requirements of the loads of the infrastructure that serves as the distributed flexible resource. It would be appreciated by those skilled in the art, that though only one distributed flexible resource is shown in FIG. 1 for clarity, the dual optimizer unit 170 is capable of handling multiple distributed flexible energy resources as an aggregated distributed flexible resource for providing reserve power schedule and bids, and also provide individual control inputs for each of the distributed flexible resource to manage their power and load requirements.

Some of the key elements of the optimization method are now described in more detail. The optimization method described herein addresses two types of objective frameworks. In some implementations, the distributed flexible resources are used as commercial resources (cDFR), with the objective of the optimization being maximizing the total benefit—cost over the 24-hour time horizon (or any user determined prediction horizon or time cycle). Both Up and Down reserve markets are considered in the formulation of the optimization problem. In some other implementations, utility operated distributed energy resources (uDFR) are considered that target load serving entities and utilities to offset their regulation service responsibility. For the uDFR, the objective is to determine the least cost way of self-providing the reserve. Once this solution is calculated, it is compared against an option of purchasing this reserve service. If the self-provision of reserve is cheaper than purchasing of the reserve, then the utility DFR can use the flexible loads and DFR to self-provide the reserve. If not, the utility DFR can purchase the reserve obligation.

In general, the output of the optimization problem is a schedule over a prediction horizon, for example the day-ahead reserve schedule (both category 2 and 3 reserves) for providing a bid for the power grid. A 24 hour schedule is considered in the examples below but any other prediction horizon or time cycle as required may also be chosen.

One key consideration while formulating the optimization problem is to explicitly account for uncertainties. Each load is associated with some inherent uncertainties. The uncertainties in some examples are in parameters of the load model or in some examples are in the form of disturbances. For example, there is an uncertainty in ambient temperature forecast for a commercial building with High Voltage alternating Current (HVAC) loads. The maximum and minimum power that a load consumes is affected by these uncertainties. In order to account for that, the power reserve capacity is calculated for the worst cases, which leads to a maxmin optimization framework. The optimization solution determines a profitable reserve schedule over a prediction horizon (for example, the day-ahead 24 hours). The maxmin optimization maximizes the 24-hour profit (revenue–cost) in the worst case scenario and thus provides a bound on how much the power schedules can deteriorate due to load model parameter uncertainty. The worst case scenario is defined as having parameter values that lead to the least profit. Given these worst case parameter values, the load trajectories are determined (and as a result the load flexibility power profiles) that maximize the profit. Through this methodology the flexibility profiles that lead to maximum profit are determined while considering worst case load model parameters.

The optimization strategies include the following definitions for decision parameters:

$x_i$ is a vector (of length=number of samples in a 24-hour time horizon) containing states and inputs of load i over the prediction horizon (for example, next 24 hours). This is the state of the load model. For example, for a building load represented by a RC circuit model, the states of the model are represented as $x_i$. These are the commercial building (sometimes referred herein as "building") zone temperatures.

$\alpha_i$ is a vector representing parameters characterizing uncertainties of the load that belongs to uncertainty set $\alpha_i \in \Omega_i$. For example, for building loads, the decision parameters are the external wall resistance and fast moving air capacitance. Each parameter value may not be known precisely, and so a set of possible parameter values denoted by $\Omega_i$ are considered.

$z_i(x_i, \alpha_i)=0$ represents discretization of the differential equations describing the load i over the prediction horizon.

$g_i(x_i, \alpha_i) \leq 0$ represents a set of algebraic constraints of each load that are necessary to follow. For example, for building loads, this would be the Ashrae standard constraints or maintenance/safety constraints.

$P_i = h_i(x_i, \alpha_i)$ is an algebraic equation set that relates the load power profile to the load model over the prediction horizon of interest.

$C_i = C_i(x_i, \alpha_1)$ represents the cost that the realization $x_i$ incurs. This is the cost incurred by the load and/or DER in order to provide the flexibility at any given time. This would typically be the energy cost incurred in order to provide the additional power output.

$M_u$, $M_l$ and $M_{C3}$ are vectors representing the price that a reserve service provider would pay for category 2 Up, category 2 Down and category 3 reserves respectively (in $/MW). The length of these vectors is equal to the total samples in the day-ahead time horizon. These are obtained based on historic payment data for each type of reserve service.

$P_i^{nom}$ is a vector representing the nominal power profile of load i over the 24 hour day-ahead time horizon. The size of this vector is equal to the total number of time samples in the 24-hour day-ahead time horizon. This is assumed to be available from load and DER power forecasts.

The optimization formulations for the cDFR and uDFR problems as referred herein above, are explained in more detail herein below.

Commercial DFR: For a cDFR, the objective of the optimization problem is to maximize the total profit (i.e., revenue−cost) over the 24-hour time horizon. Assume $x_i^u$ represents a realization of load i that tries to maximize the profit for up reserves, $x_i^l$ is the realization of load i that tries to maximize the profit for down reserves. The Up reserves include category 2 as well as category 3 reserves, and the goal is to maximize the profit across different reserve services simultaneously (note: an assumption used is that there is only one signal for category 3, unlike category 2 which can have up or down signals). Then, the total revenue is given as $$M_u^T \left( \sum_{i=1}^{N_{load}} P_i^{C2up} - P_i^{nom} \right) + M_l^T \left( \sum_{i=1}^{N_{load}} P_i^{nom} - P_i^{C2down} \right) + M_{C3}^T \left( \sum_{i=1}^{N_{load}} P_i^{C3} - P_i^{nom} \right)$$

The total cost is given as $$\sum_{i=1}^{N_{load}} (C_i(x_i^u, \alpha_i) + C_i(x_i^l, \alpha_i))$$

The cost includes the additional cost of energy to provide the reserve and any additional cost that can be associated with such a service (e.g., there may be an indirect cost of switching certain loads with regard to the impact on life of the actuator). If this cost includes just the cost of providing the additional energy, then $C_i(x_i^l, \alpha_i)$ can be chosen as 0, as there is no energy cost incurred when reducing the load.

As mentioned above, the goal of the optimizer is to maximize the profit while accounting for the worst case parameter values (where worst case refers to the parameters that lead to least profit). Therefore, the objective function is then given as $$\max_{\substack{x_i^u, x_i^l, \\ P_i^{C2up}, P_i^{C2down}, \\ P_i^{C3}}} \min_{\alpha_i \in \Omega_i} \left[ M_u^T \left( \sum_{i=1}^{N_{load}} P_i^{C2up} - P_i^{nom} \right) + M_l^T \left( \sum_{i=1}^{N_{load}} P_i^{nom} - P_i^{C2down} \right) + M_{C3}^T \left( \sum_{i=1}^{N_{load}} P_i^{C3} - P_i^{nom} \right) \right] - \left[ \sum_{i=1}^{N_{load}} C_i(x_i^u, \alpha_i) + C_i(x_i^l, \alpha_i) \right]$$

The constraints on the load model are given as $$z_i(x_i^u, \alpha_i) = 0, g_i(x_i^u, \alpha_i) \leq 0 \qquad (1.a)$$

$$z_i(x_i^l, \alpha_i) = 0, g_i(x_i^l, \alpha_i) \leq 0 \qquad (1.b)$$

$$P_i^{C2up} + P_i^{C3} = h_i(x_i^u, \alpha_i) \qquad (1.c)$$

$$P_i^{C2down} = h_i(x_i^l, \alpha_i) \qquad (1.d)$$

Constraints (1.c) and (1.d) relate the total Up-power for a load to the corresponding Up-states and total Down-power to corresponding Down-states. For example, for a building load, the total up-power resulting from a changed temperature set-point is given by (1.c).

The constraints on the category 2 up/down and category 3 reserves are given as $$\sum_{i=1}^{N_{load}} P_i^{C2up} \geq \sum_{i=1}^{N_{load}} P_i^{nom} \qquad (2)$$

$$\sum_{i=1}^{N_{load}} P_i^{nom} \geq \sum_{i=1}^{N_{load}} P_i^{C2down} \qquad (3)$$

$$\sum_{i=1}^{N_{load}} P_i^{C3} \geq \sum_{i=1}^{N_{load}} P_i^{nom} \qquad (4)$$

Typically, the hourly up and down reserves (e.g., regulation) are symmetrical at the aggregate level. To account for this, a constraint is introduced as $$\sum_{i=1}^{N_{load}} \sum_{k=N_{step}*(T-1)}^{N_{step}*T} P_{i_k}^{C2up} = \sum_{i=1}^{N_{load}} \sum_{k=N_{step}*(T-1)}^{N_{step}*T} P_{i_k}^{C2down} \forall T = [1, 24 \text{ hr}] \qquad (5)$$

where, Nstep denotes the total number of steps in a 1-hour time slot. For example, if the granularity of the optimization is chosen as 1 minute, then Nstep=60 min.

The technical requirements for category 2 and 3 reserves may be provided by a government agency with regard to the aggregate ramp rate and reserve margin target.

Figure 3:
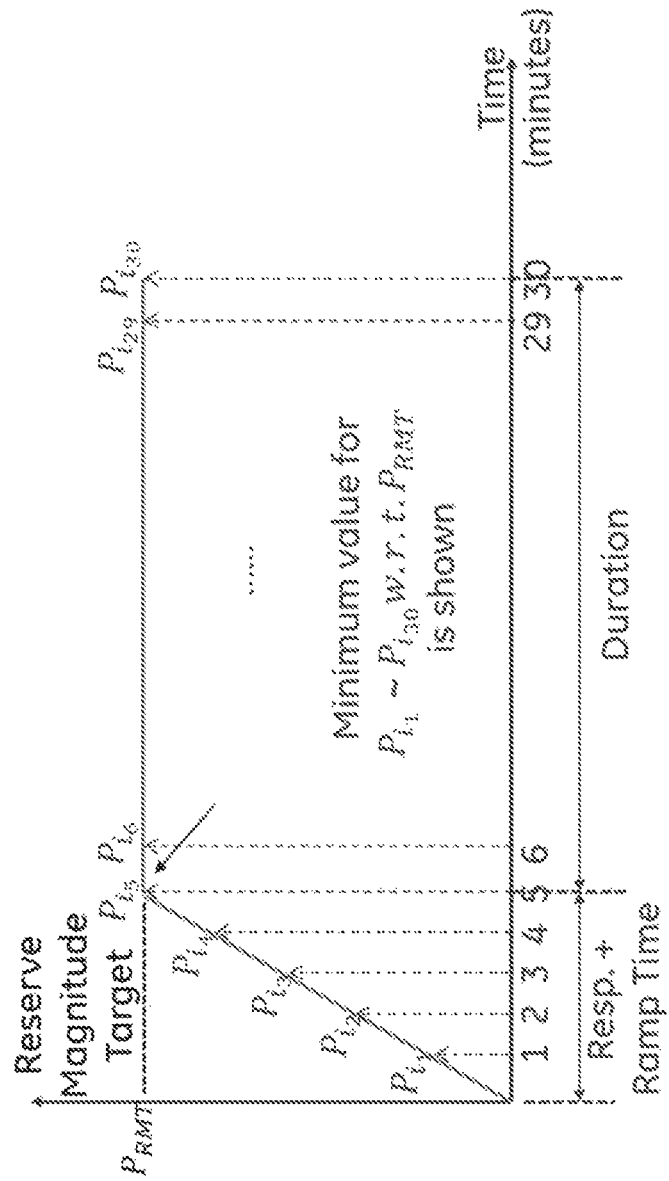
FIG. 3 is a graphical representation of technical requirements for reserve power.

FIG. 3 is a graphical representation 400 that provides an example technical requirement for category 2 reserves. In order to meet the duration requirement of at least 30 minutes, a constraint can be imposed such that all the aggregate power flexibilities beyond 5 minutes must be greater than the value at 5 minutes for a duration of 30 minutes. To account for the ramp rate requirement, a constraint on flexible power outputs at the aggregate level for each of the sample intervals during the first 5 minutes must be greater than the corresponding value determined by the ramp. These are described mathematically in equations (6) and (7) respectively.

In order to account for these requirements, the following constraints are introduced $$\sum_{i=1}^{N_{load}} (P_{i_k}^{C2up} - P_{i_k}^{nom}) \geq \sum_{i=1}^{N_{load}} (P_{i_5}^{C2up} - P_{i_5}^{nom}) \\ \forall k = [5, 30 \text{ min}] \qquad (6.a)$$

$$\sum_{i=1}^{N_{load}} (P_{i_k}^{nom} - P_{i_k}^{C2down}) \geq \sum_{i=1}^{N_{load}} (P_{i_5}^{nom} - P_{i_5}^{C2down}) \forall k = [5, 30 \text{ min}] \qquad (6.b)$$

$$\sum_{i=1}^{N_{load}} (P_{i_k}^{C3} - P_{i_k}^{nom}) \geq \sum_{i=1}^{N_{load}} (P_{i_{30}}^{C3} - P_{i_3}^{nom}) \forall k = [30, 180 \text{ min}] \qquad (6.a)$$

The above constraints ensure that the flexibility is maintained for at least 30 minutes for category 2 reserves, and at least 3 hours for category 3 reserves. The optimization sampling interval is assumed to be in minutes (typically 1 to 5 minutes). Another set of constraints is introduced to ensure that the ramp time for category 2 is at least 5 minutes and for category 3 is at least 30 minutes as follows $$\sum_{i=1}^{N_{load}} \left(P_{i_k}^{C2up} - P_{i_k}^{nom}\right) \geq \left(\frac{k}{5}\right) * \sum_{i=1}^{N_{load}} \left(P_{i_5}^{C2up} - P_{i_5}^{nom}\right) \forall k = [1, 5 \text{ min}] \quad (7.a)$$

$$\sum_{i=1}^{N_{load}} \left(P_{i_k}^{nom} - P_{i_k}^{C2down}\right) \geq \left(\frac{k}{5}\right) * \sum_{i=1}^{N_{load}} \left(P_{i_5}^{nom} - P_{i_5}^{C2down}\right) \forall k = [1, 5 \text{ min}] \quad (7.b)$$

$$\sum_{i=1}^{N_{load}} \left(P_{i_k}^{C3} - P_{i_k}^{nom}\right) \geq \left(\frac{k}{30}\right) * \sum_{i=1}^{N_{load}} \left(P_{i_{30}}^{C3} - P_{i_{30}}^{nom}\right) \forall k = [1, 30 \text{ min}] \quad (7.c)$$

where, $P_{i_k}^{C2up}$ denotes the additional up reserve power output of load i at time instant k, $P_{i_5}^{C2up}$ denotes the additional up reserve power output at 5 minutes, $P_{i_k}^{C2down}$ own denotes the additional down reserve power output of load i at time instant k, $P_{i_k}^{C3}$ denotes the additional category 3 reserve power output of load i at time instant k, $P_{i_5}^{C2down}$ denotes the additional down reserve power output at 5 minutes, $P_{i_k}^{nom}$ denotes the nominal power output for load i at time instant k, $P_{i_5}^{nom}$ denotes the nominal power output for load i at 5 minutes, $P_{30}^{nom}$ denotes the nominal power output for load i at 30 minutes.

Once the above optimization problem is solved, the optimal solution can be used to derive the hourly schedules for the aggregate loads by using:

$$\Delta P^{up}(T) = \Sigma_{k=Nstep*(T-1)}^{Nstep*T} \Sigma_{i=1}^{Nload} (P_{i_k}^{C2up} - P_{i_k}^{nom}) \\ \forall T=[1,24 \text{ hr}] \quad (8.a)$$

$$\Delta P^{down}(T) = \Sigma_{k=Nstep*(T-1)}^{Nstep*T} \Sigma_{i=1}^{Nload} (P_{i_k}^{nom} - P_{i_k}^{C2down}) \forall T=[1,24 \text{ hr}] \quad (8.b)$$

$$\Delta P^{C3}(T) = \Sigma_{k=Nstep*(T-1)}^{Nstep*T} \Sigma_{i=1}^{Nload} (P_{i_k}^{C3} - P_{i_k}^{nom}) \\ \forall T=[1,24 \text{ hr}] \quad (8.c)$$

Now referring to the implementations which use the Utility DFR (uDFR) framework, the objective is to determine if it is economically better to self-provide the reserve or to purchase the reserve. The obligation of a utility is typically calculated as the percentage metered demand to total demand for that particular interval and zone. For example, if a utility has 5% metered demand relative to the total demand, its obligation would be 5% of the total regulation. This obligation can either be purchased or self-provided by the utility. The goal of the optimizer is to solve an optimization problem to determine the least cost solution to self-provide the reserve, and then compare it with the cost to purchase the reserve. If the option of self-provision of reserve is cheaper than the option to purchase, then the aggregator will be able to self-provide. If not, the aggregator should purchase the reserve service.

The objective function in this case is given by $$\max_{\substack{x_i^u, x_i^l, \\ P_i^{C2up}, P_i^{C2down}, \\ P_i^{C3}}} \min_{\alpha_i \in \Omega_i} - \left[\sum_{i=1}^{N_{load}} C_i(x_i^u, \alpha_i) + C_i(x_i^l, \alpha_i)\right]$$

It may be noted here that compared to the commercial DFR, the utility DFR does not have a revenue term. This is because the utility is obligated to provide this service, and so there is only a cost term.

The constraints (1) to (7) would still apply in this problem. In addition, a constrain to relate the utility obligation with the total flexibility for each hour is given as $$R^{up}(T) = \Sigma_{k=Nstep*(T-1)}^{Nstep*T} \Sigma_{i=1}^{Nload}(P_{i_k}^{C2up} - P_{i_k}^{nom}) \\ \forall T=[1,24 \text{ hr}] \quad (9.a)$$

$$R^{down}(T) = \Sigma_{k=Nstep*(T-1)}^{Nstep*T} \Sigma_{i=1}^{Nload}(P_{i_k}^{nom} - P_{i_k}^{C3}) \\ \forall T=[1,24 \text{ hr}] \quad (9.b)$$

$$R^{C3}(T) = \Sigma_{k=Nstep*(T-1)}^{Nstep*T} \Sigma_{i=1}^{Nload}(P_{i_k}^{C3} - P_{i_k}^{nom}) \\ \forall T=[1,24 \text{ hr}] \quad (9.c)$$

where, $R^{up}(T)$ is the category 2 up reserve obligation for the hour T, $R^{down}(T)$ is the category 2 down reserve obligation for the hour T, and $R^{C3}(T)$ is the category 3 reserve obligation for the hour T. Additionally, the utility has to ensure that while its loads and DERs are providing the reserve service, there are no network violations. These network violations are considered as constraints, given by $$P_{Line}^L \leq QP \leq P_{Line}^U \quad (10)$$

The matrix Q is computed as follows. Assuming a DC power flow approximation, $$P = B'\theta \quad (11)$$

where, P is a vector of power injection at all the buses, B' is a square matrix corresponding to the network admittances, θ is a vector of bus voltage angles at all the buses. This equation is solved using the known admittance matrix and power injections to obtain the bus voltage angle vector. Once this is obtained, the following line constraint is imposed:

$$P_{min} \leq B_{mn}(\theta_m - \theta_n) \geq P_{max} \quad (12)$$

This can be written in a more compact form as shown in (9), where, Q is a rectangular matrix with rows equal to number of lines and columns equal to number of buses. Q is formed using a combination of elements of B along with a matrix of 0's and 1's.

Once the above optimization problem is solved, the optimal solution can be used to derive the hourly schedules for the aggregate loads similar to the commercial DFR problem (equation (8.a)-(8.c)). Finally, the overall cost for each hourly slot can be calculated using the optimal solution and compared against the cost of purchasing the reserve to determine which option is more economically suitable.

EXAMPLES

Below are two simulation cases, one to calculate 24-hour Down reserve capacity and one to calculate 24-hour Up reserve capacity. Both simulation cases include 100 HVAC loads rated 5~10 kW with different model parameters.

Figure 4:
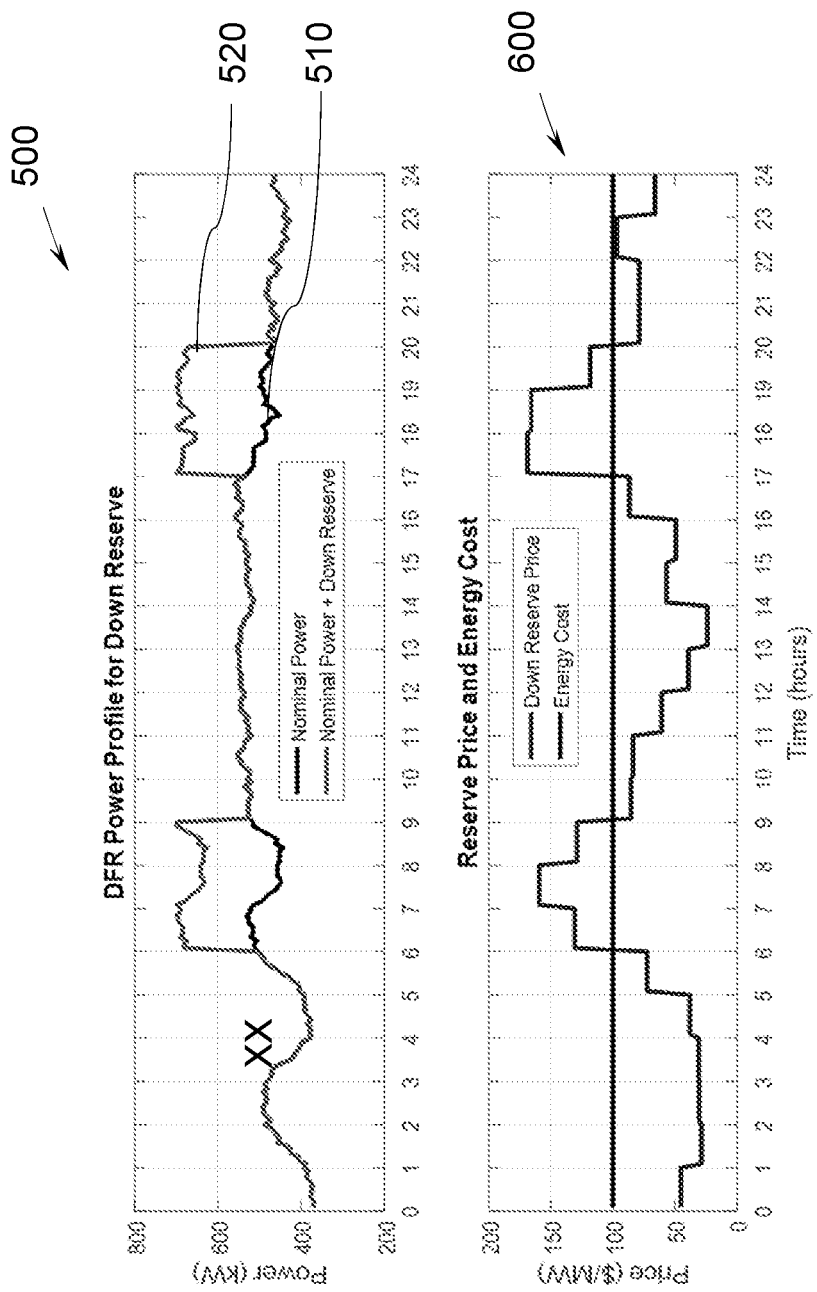
FIG. 4 is a graphical representation of a simulated example of use of the system and method embodiments showing distribution of load power with and without Down reserves.

FIG. 4 shows two Plots, Plot 500 and Plot 600 showing load power with and without down reserves, where Plot 600 shows Down reserve price and energy cost. This reserve price profile is a representative price profile from a high price day. Since load needs to increase the power consumption to provide Down reserve which will increase its energy cost, it only makes economic sense for load to provide Down reserve when reserve price is higher than the energy cost. The curve 510 in Plot 500 shows the total nominal power of 100 loads, while the curve 520 shows the total power of 100 loads including its Down reserve capacity. From Plot 600 it can be seen that the optimizer provides a Down reserve for hours 6-9 and 17-20 when the reserve price is higher than the energy cost and the net profit is positive.

Figure 5:
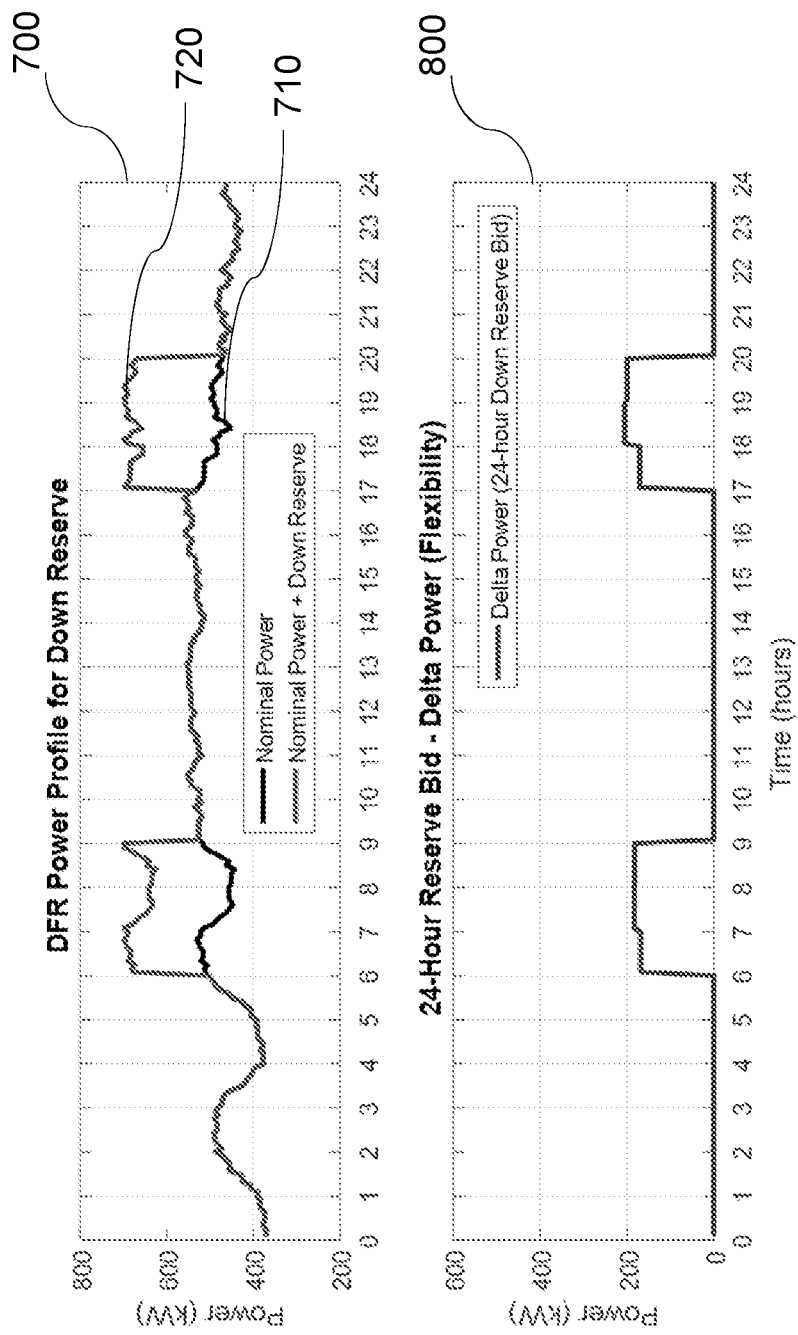
FIG. 5 is a graphical representation of a simulated example of use of the system and method embodiments showing distribution of total load power and 24-hour Down reserve bid.

FIG. 5 shows the plots for total load power and 24-hour Down reserve bid. It would be noted here that the reserve power bid for day-ahead reserve market would be 24-hour flexibility of load, or the capacity of load to move away from its nominal power. Plot 800 in FIG. 5 shows the Down reserve power bid which is the difference between the curves 710 and 720 in Plot 700, or the delta power between the nominal load profile and the new load profile including Down reserve capability.

Figure 6:
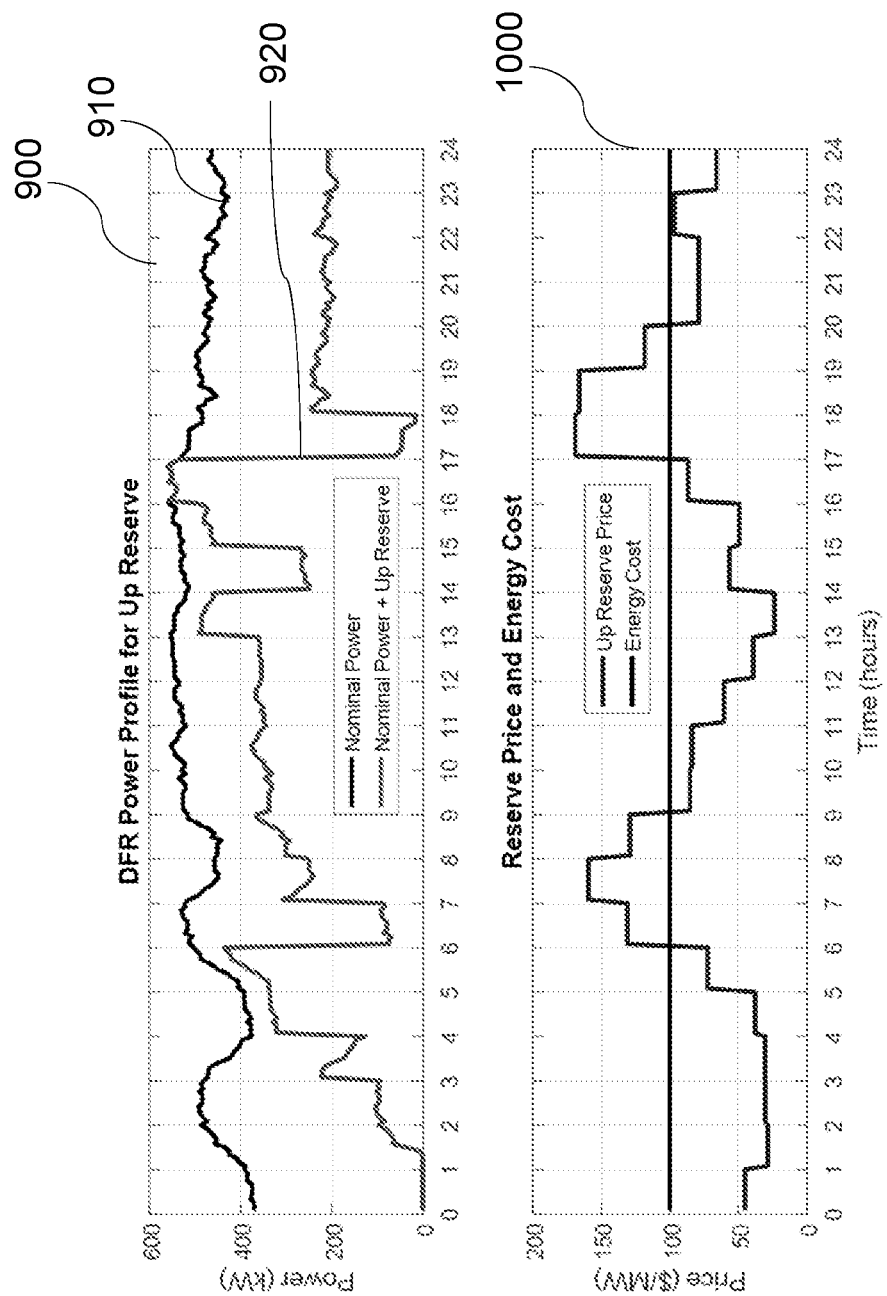
FIG. 6 is a is a graphical representation of a simulated example of use of the system and method embodiments showing a distribution of load power with and without Up reserve.

FIG. 6 shows a simulation to forecast day-ahead Up reserve with the same reserve price and energy cost. When load provides Up reserve, the power consumption of the load is reduced, thus reduces the associated energy cost. Therefore, it is always profitable for load to provide Up reserve. It can be observed from Plot 900 in FIG. 6 that the optimizer decides to provide Up reserve almost for every hour. The amount of capacity for each hour is impacted by the reserve price and energy cost. Plot 1000 in FIG. 6 shows that the capacity for hour 16-17 is very limited (difference between the 910 and 920 curves) which could be a saving of Up capacity to claim the most benefit for hour 17-18 when the reserve price is significantly higher.

Figure 7:
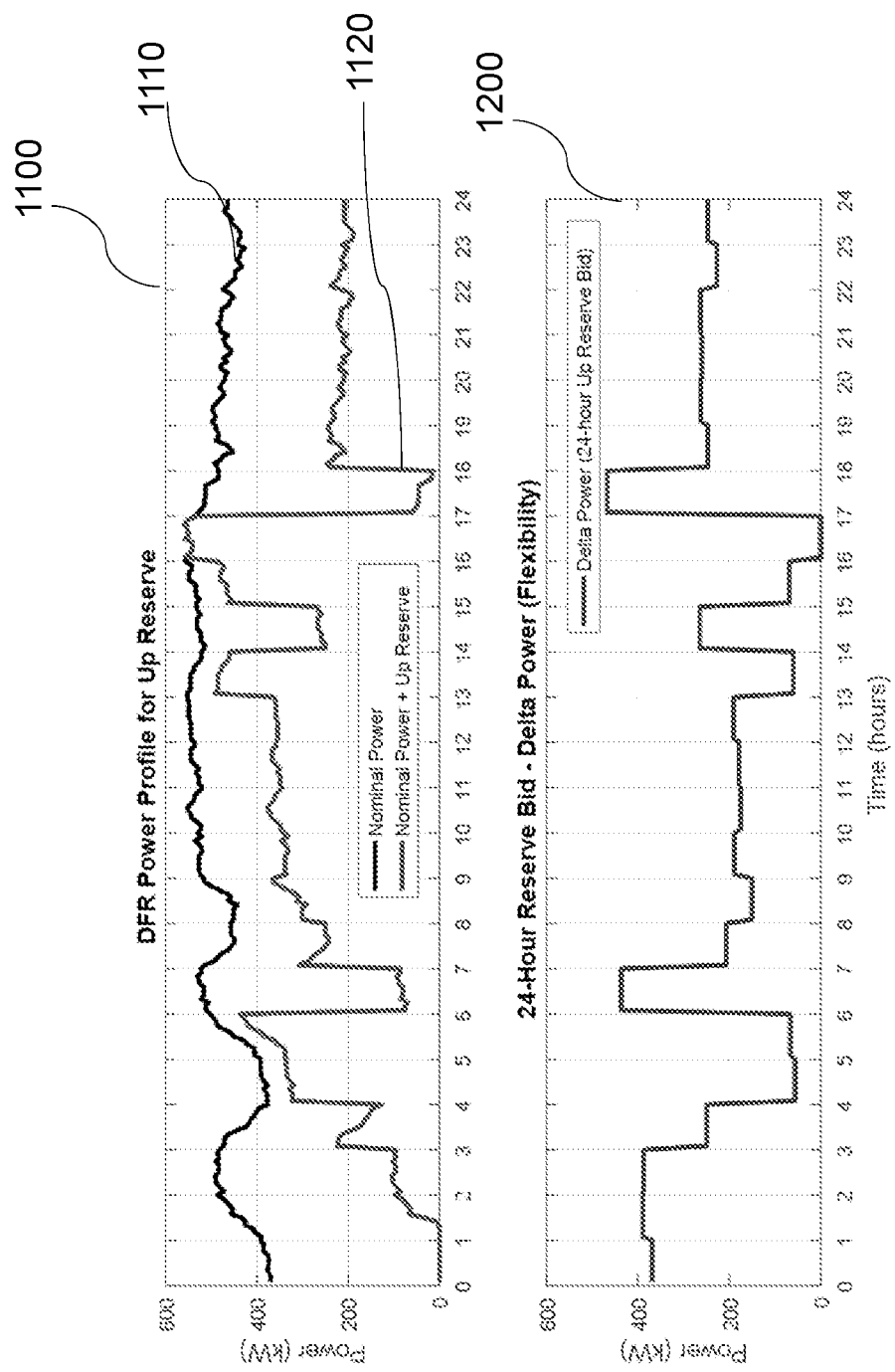
FIG. 7 is a graphical representation of simulated example of use of the system and method embodiments showing a distribution of total load power and 24-hour Up reserve bid.

FIG. 7 show the plots 1100 and 1200 for total load power and 24-hour Up reserve bid. Plot 1200 in FIG. 7 shows the Up reserve power bid which is the difference between the curves 1110 and 1120 in Plot 1100 of FIG. 7, or the delta power between the nominal load profile and the new load profile including Up reserve capability.

It would be appreciated by those skilled in the art that the accuracy of day-ahead DFR forecast is subject to uncertainties. Taking HVAC loads as an example, the uncertainty could be with thermal resistance and capacitance (R, C), day-ahead ambient temperature forecast ($\tau^A$) and estimate of the initial temperature of the load ($T_0$). The optimization method also accounts for uncertainty to make the forecasted day-ahead load flexibility feasible in real-time to achieve without violating constraints for any R, C, $\tau^A$, $\tau_0$ value in their [min, max] range, which are also referred as Quality of Service constraints.

In one implementation, uncertainty is accounted for based on monotonic system theory and only boundary values of parameters are considered to ensure feasibility in the entire parameter range. The advantage of this approach is to avoid enumeration on possible parameter values and large number of simulations.

In the optimization to get the 24-hour flexibility, two sets of parameters are considered and used to generate maximum temperature envelope and minimum temperature envelop for each load. Optimal solution is generated with respect to the constraints that both the maximum and minimum temperature envelopes for each load stay within the QoS range.

Each parameter with uncertainty is assumed to vary within some percentage range $$\left(\pm 5\% \text{ for } \alpha, \pm 5\% \text{ for } \beta, \pm 1\% \text{ for } T_A, \pm 2\% \text{ for } T_0, \alpha = \frac{1}{RC}, \beta = \frac{1}{C}\right).$$

(These ranges of parameters come from the flexible resource model). Flexibility optimization uses two sets of boundary values of parameters and generates power bid forecast ($P_{bid}$) and new power profile with reserve capacity included for each load. Then 200 sets of [$\alpha_{select}$, $\beta_{select}$, $\tau_{select}^A$, $\tau_{0select}$] are randomly selected from the parameter uncertainty range. Load temperatures with the power profile decided by the optimizer based on boundary conditions and the randomly selected parameter values are calculated.

Figure 8:
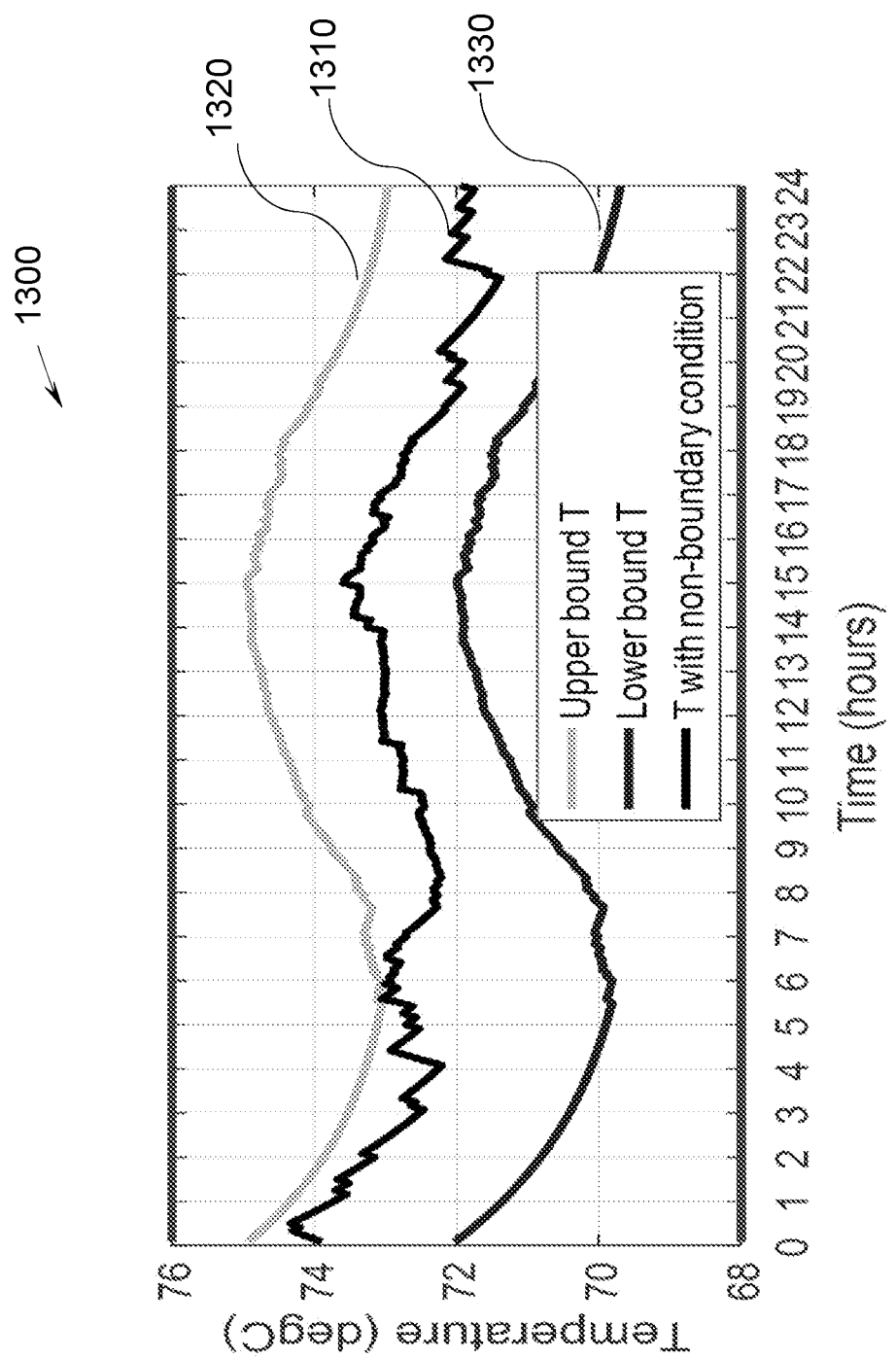
FIG. 8 is a graphical representation of simulated example of use of the system and method embodiments showing distribution of temperature one load as an example of management of a load.

All 200 simulations show that all resulted load temperature profiles with the randomly selected parameter values stay within the temperature envelopes thus within the QoS bounds. FIG. 8 shows a plot 1300 as an example that one load temperature with one set of non-boundary parameter values referred by reference numeral 1310 stays within its upper and lower temperature bounds shown by curves 1320 and 1330 for the entire 24-hour horizon.

As explained herein above, for commercial DFR (cDFR), loads are aggregated within a given coverage and ancillary service is provided to the reserve service provider. For a cDFR, the objective of the optimization is to maximize the total benefit—cost over the 24-hour time horizon. FIG. 4 and FIG. 6 respectively demonstrate the resulted Down reserve and Up reserve forecast for cDFR which take into consideration both the ancillary service price and energy cost.

For utility operated DFR (uDFR), load serving entities and utilities leverage load flexibility to offset their reserve responsibility. For a utility DFR (uDFR), the objective is to determine if it is economically better to self-provide the reserve or to purchase the reserve. As explained earlier, the goal in this case is to solve an optimization to determine if utility can fulfill its reserve obligation with its load flexibility and what is the least cost solution to self-provide the reserve.

Figure 9:
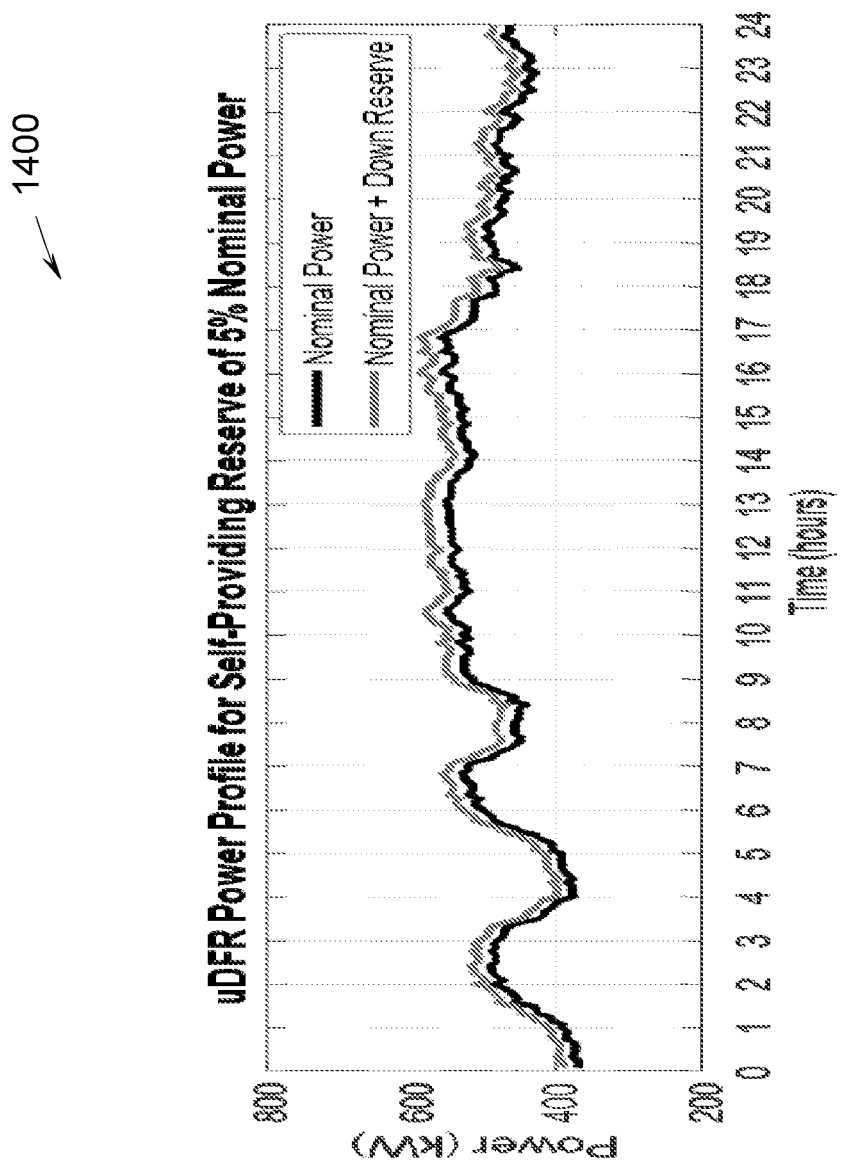
FIG. 9 is a graphical representation of simulated example of use of the system and method embodiments showing a distribution of Utility distributed flexible reserve (uDFR) power profile for a self providing down reserve of 5% nominal power.

In one simulation example, 100 HVAC loads rated 5~10 kW with different model parameters were considered. It was assumed that the reserve obligation for the utility DFR owner was 5% of the nominal power of the 100 loads. The optimization problem was framed to minimize the cost of providing the required amount of Down reserve. FIG. 9 shows a plot 1400 Plot that has the 100-load total nominal power and power profile when Down reserve capacity is considered to fulfill the obligation. With this least-cost solution, the utility is capable of self-providing obligated reserve and the energy cost of self-providing is $51.75k. Assuming this is all the self-providing cost, then next step, the utility could compare this against cost of purchasing reserve from market, and decide if that is economical or not.

In another example participation of DFRs in Category 2 and Category 3 reserve markets for maximizing profit is shown. Taking Up reserve markets as an example (Category 3 only has Up reserve), the optimizer determines the total Up capability of the load and decide how to split them into Category 2 Up and Category 3 Up based on different reserve prices of these two markets to maximize its profit.

Figure 10:
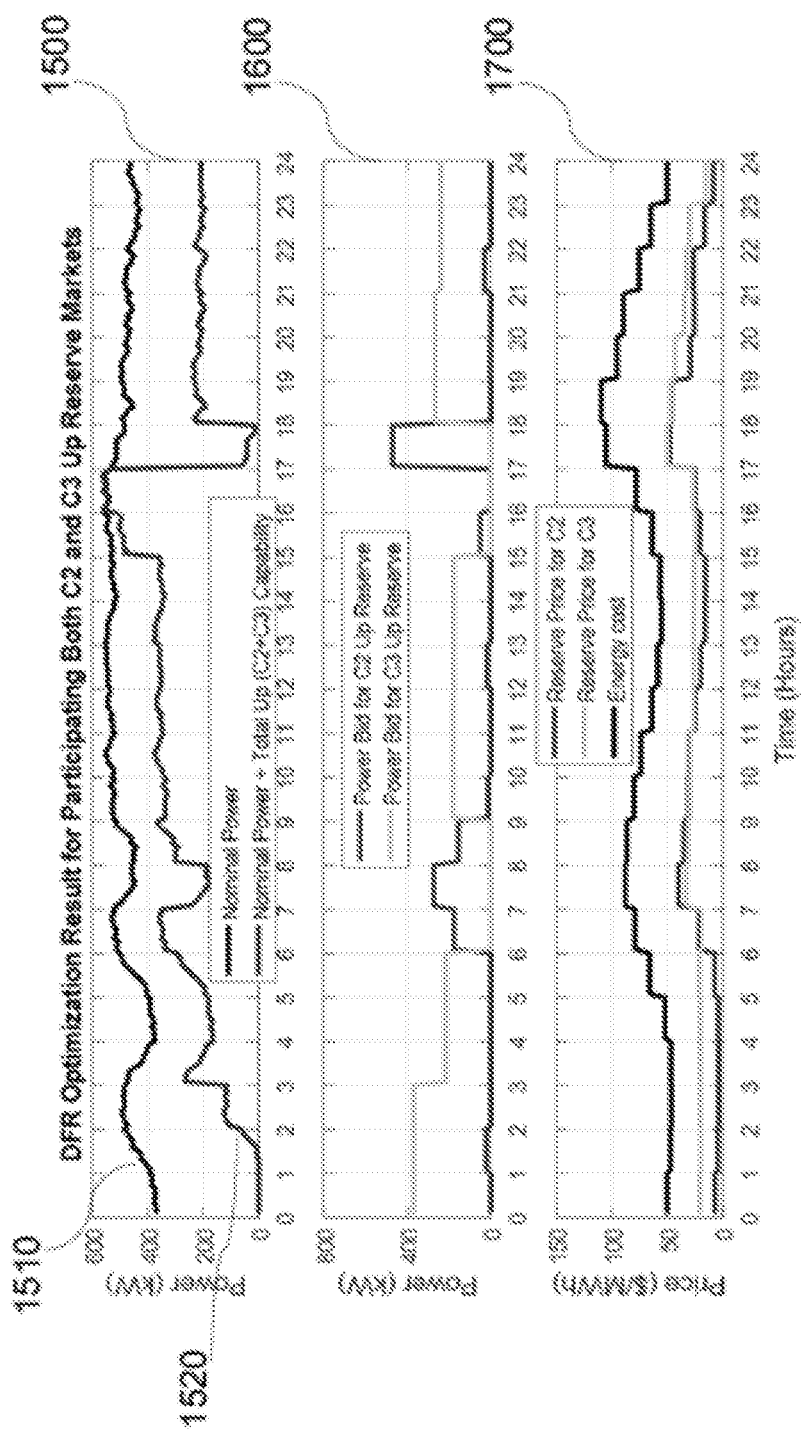
FIG. 10 is a graphical representation of a simulated example of use of the system and method embodiments showing an optimization output for participating both Category 2 and Category 3 Up reserve markets.

FIG. 10 shows DFR optimization result for participating both C2 Up and C3 Up reserve markets through plots 1500, 1600, and 1700. The simulation includes 100 HVAC loads rated 5~10 kW with different model parameters. Plot 1700 in FIG. 10 shows C2 and C3 reserve price and energy cost. The 1510 curve in Plot 1500 shows the nominal power plus the total (C2+C3) Up capability. The split of Up capability or the split of delta power between the curves 1510 and 1520 is shown in Plot 1600. In the simulation case, C3 price is higher than C2 price for most of the hours and the Plot 1600 shows most of the hours the optimizer decides to put all the Up capability in C3. While for hours when C2 price is higher like hour 7~8 and hour 17-18, the optimizer decides to do C2. And for some hours, like hour 1~2 and hour 21~22, the load is able to claim profit in both markets. This simulation also shows that small HVAC loads (5~10 kW), when stacked up together, are able to provide tens of and even hundreds of kW flexibility that last up to 3 hours.

Figure 11:
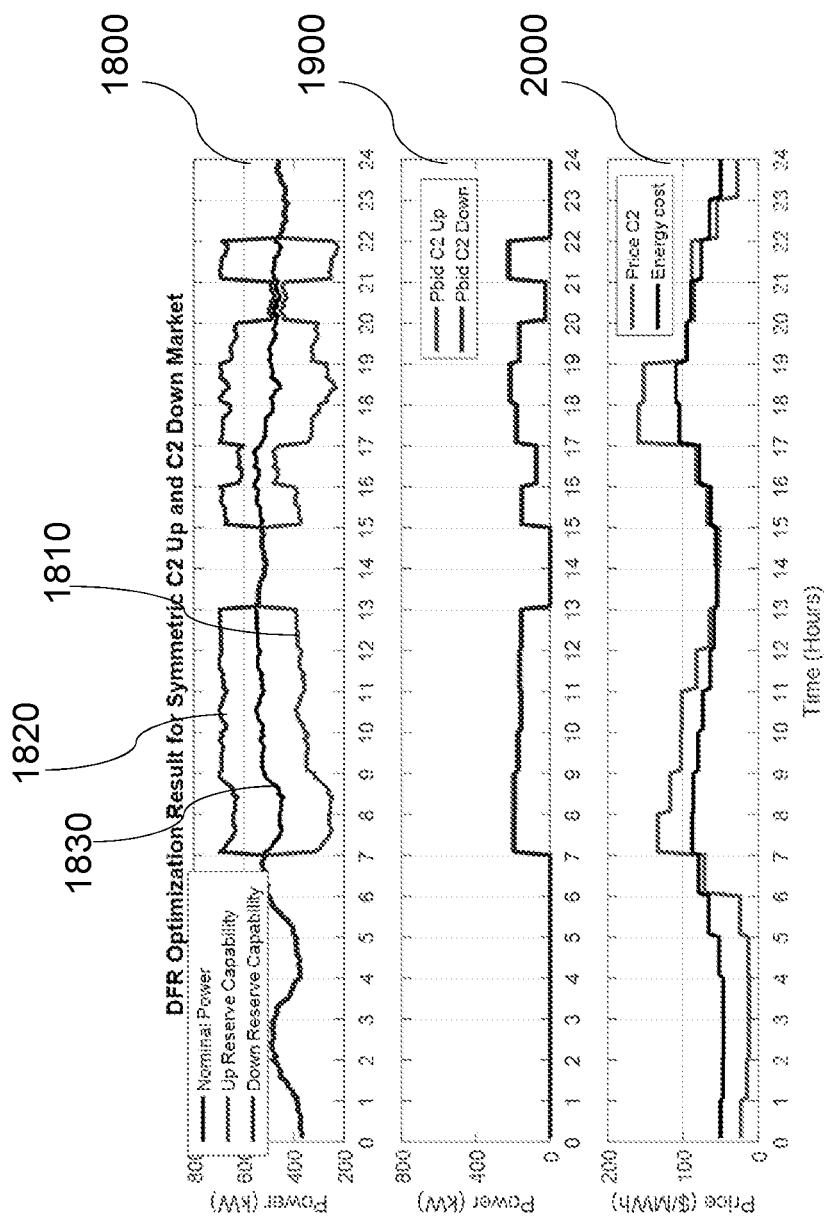
FIG. 11 is a graphical representation of simulated example of use of the system and method embodiments showing an optimization output for symmetric C2 Up and C2 Down reserve market.

In another example a symmetric bid for both C2 Up and C2 Down reserve is shown as in plots of FIG. 11 where loads need to be able to move the power up or down with the same amount for bidding in C2 market. To solve for this market requirement, the optimizer will solve for both Up and Down capacities with the constraints that two capacities in each hour will be the same.

FIG. 11 shows DFR optimization result for symmetric C2 Up and C2 Down markets. The simulation includes 100 HVAC load rated 5~10 kW each and with different model parameters. Plot 2000 shows the reserve price and energy cost. The 1810 curve in Plot 1800 shows the nominal power plus Up reserve capability while the 1820 curve shows the nominal power plus Down reserve capability. It could be observed that they are symmetric around the nominal power profile represented by the 1830 curve. Plot 1900 shows the power bids for both Up and Down reserves which are identical.

Figure 12:
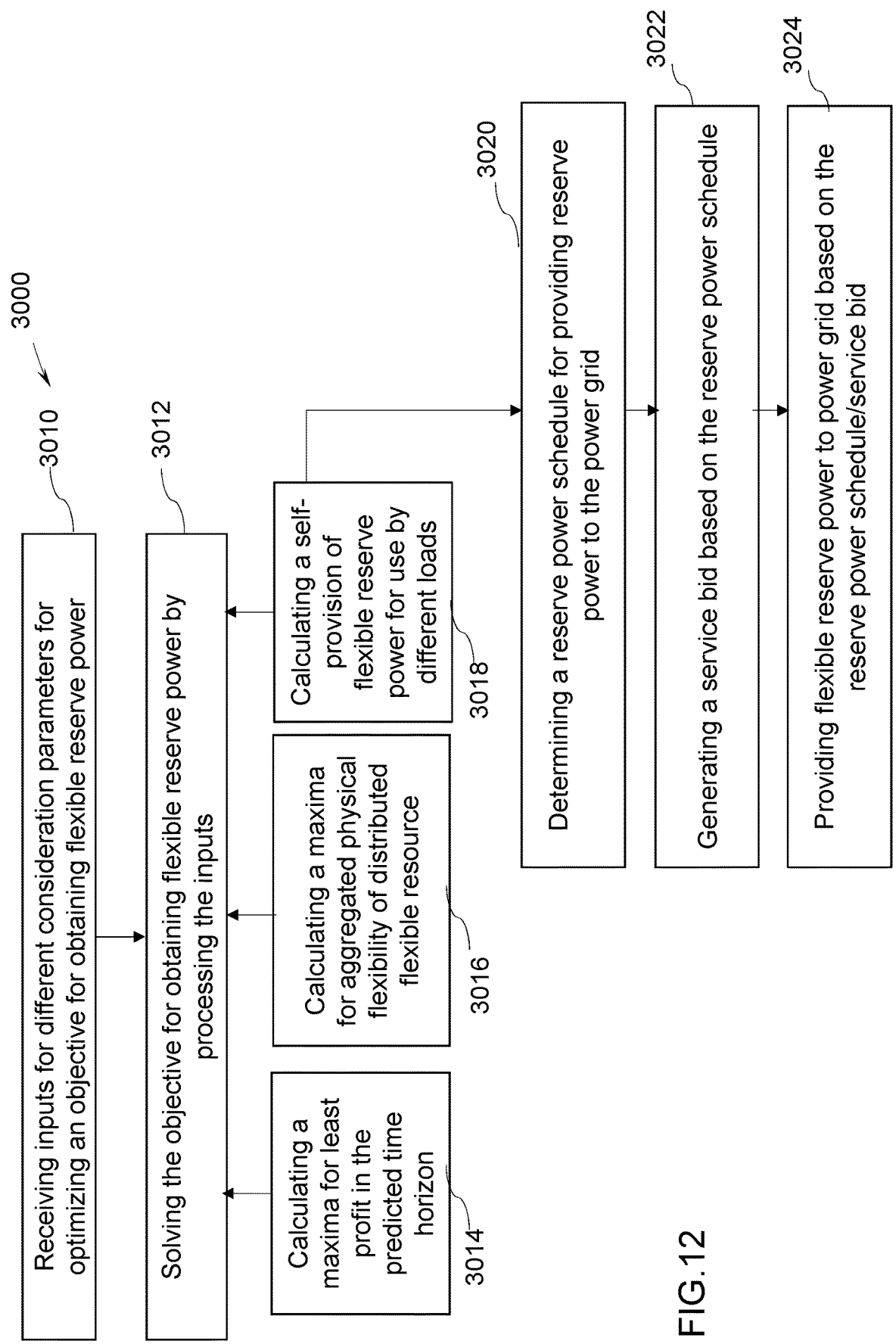
FIG. 12 is a flowchart representation of a method of providing flexible reserve power to a power grid.

The different aspects of the system and the optimization techniques are summarized in a flowchart 3000 in FIG. 12 which illustrates a method for providing flexible reserve power to a power grid in one implementation. It should be noted here, that the aspects of the method described herein are also used for managing peak loads at sub-stations in some implementations, and performance management of loads in some other implementations. In some other implementations, the method described herein is useful for managing constraints on distributed networks through the flexibility provided by aggregate loads.

The method includes a step 3010 for receiving inputs for different decision parameters for optimizing an objective for obtaining flexible reserve power predictions over the prediction horizon. These different inputs have been adequately described in reference to FIG. 2, as well in reference to the optimization method described herein above. Briefly, the inputs include pricing data for reserve power, load profile of the distributed flexible resource, energy cost data, and behavior of the distributed flexible resource, technical requirements for flexible reserve power, such as ramp up of power requirement or ramp down of power requirement or time based use of power received from the power grid. It may be noted here that the inputs associated with different loads and distributed energy resources are aggregated as inputs from a distributed flexible resource.

The method then includes a step 3012 for solving the objective for obtaining flexible reserve power by processing the inputs which includes deriving predictions for the different inputs for the prediction horizon, and using the predictions to solve the objective. The objective described herein is related to the optimization problem described herein above. The examples provided herein above also provide details of different objectives that are considered based on the inputs to derive an optimum availability of the reserve power.

A few of the different solutions for meeting different objectives are shown in the flow chart 3000, for example block 3014 shows calculating a maxima for least profit derived from providing flexible reserve power in the prediction horizon. Block 3016 shows calculating a maxima for aggregated physical flexibility of distributed flexible resources in the predicted time horizon. Block 3018 shows calculating a self provision of flexible reserve power for use by the different loads that is economical when compared to purchasing of the flexible reserve power from the power grid. It may be appreciated by those skilled in the art that the optimization solution is intelligent to handle the different inputs and predict the required objective as well that would work for the given inputs.

The method then includes a step 3020 for determining a reserve power schedule for a prediction horizon for providing flexible reserve power to the power grid based on the objective while maintaining power requirements of the distributed flexible resource. The method also includes at least for some implementations a step 3022 for generating a service bid based on the reserve power schedule. Finally, at least in some implementations, the method also includes a step 3024 for providing flexible reserve power to the power grid based on the service bid. As mentioned herein above, there may be other uses of different outputs that are derived after solving the optimization objective or problem, and include managing of the loads, and supporting the substation as well.

It would be also appreciated by those skilled in the art that a communication interface, communicating means, and a communication network will be used that allow the flow of data, user inputs and commands between different components/modules that are used to implement the method, some of which are described in reference to the system for provide flexible reserve power herein above. It would also be understood by those skilled in the art that the communication is based on standard communication protocols for communicating between the different components.

It would be further appreciated by those skilled in the art, that the different components/modules, as well as the method steps described herein, are implemented using embedded hardware and/or software by use of processors, micro-controllers, and/or input/output (I/O) components, microcomputers, programmable logic controllers (PLC), application specific integrated circuits, application-specific processors, digital signal processors (DSPs), Application Specific Integrated Circuits (ASICs), Field Programmable Gate Arrays (FPGAs), and/or any other programmable circuitry, and memory devices. The memory devices may include for example, a dynamic random access memory (DRAM) device, a static random access memory (SRAM) device, a digital versatile disc read only memory (DVD-ROM) device, a digital versatile rewritable (DVD-RW) device, a flash memory device, or other non-volatile storage devices. These components are configured as embedded circuitry to perform a variety of computer-implemented functions (e.g., performing the methods, steps, calculations and the like disclosed herein).

It would be also appreciated by those skilled in the art that user inputs, inputs and outputs associated with the system and method described herein will employ a use of suitable input and output devices including human machine interfaces. The I/O devices may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. In additional embodiments, the I/O devices may include alphanumeric input components (e.g., a keyboard, a touch screen configured to receive alphanumeric input, a photo optical keyboard, or other alphanumeric input components), point based input components (e.g., a mouse, a touchpad, a trackball, a joystick, a motion sensor, or other pointing instrument), tactile input components (e.g., a physical button, a touch screen that provides location and/or force of touches or touch gestures, or other tactile input components), audio input components (e.g., a microphone), and the like.

In some embodiments, a non-transitory computer readable medium may be encoded with a program having instructions to instruct the system 100 of FIG. 1 to perform functions described for these systems and their components.

It would be further understood that not necessarily all such objects or advantages described above may be achieved in accordance with any particular embodiment. Thus, for example, those skilled in the art will recognize that the systems and techniques described herein may be embodied or carried out in a manner that achieves or improves one advantage or group of advantages as taught herein without necessarily achieving other objects or advantages as may be taught or suggested herein.

While the technology has been described in detail in connection with only a limited number of embodiments, it should be readily understood that the specification is not limited to such disclosed embodiments. Rather, the technology can be modified to incorporate any number of variations, alterations, substitutions or equivalent arrangements not heretofore described, but which are commensurate with the spirit and scope of the claims. Additionally, while various embodiments of the technology have been described, it is to be understood that aspects of the specification may include only some of the described embodiments. Accordingly, the specification is not to be seen as limited by the foregoing description, but is only limited by the scope of the appended claims.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A non-transitory computer readable medium having executable instructions stored thereon, that when executed by a processor, cause the processor to perform a method for providing flexible reserve power to a power grid, the method comprising:
   receiving a plurality of inputs for a plurality of decision parameters for optimizing an objective for obtaining flexible reserve power;
   solving the objective for obtaining flexible reserve power by processing the plurality of inputs, wherein inputs associated with a plurality of loads and distributed energy resources from the plurality of inputs are aggregated as inputs from a distributed flexible resource;
   determining a reserve power schedule for a prediction horizon for providing flexible reserve power to the power grid based on the objective while maintaining power requirements of the distributed flexible resource;
   generating a service bid based on the reserve power schedule for the power grid; and
   when the service bid is accepted, providing flexible reserve power to the power grid based on the service bid.

2. The non-transitory computer readable medium of claim 1 wherein the plurality of inputs comprise predictions over the prediction horizon for pricing data for reserve power, load profile of the distributed flexible resource, energy cost data, and behavior of the distributed flexible resource.

3. The non-transitory computer readable medium of claim 2 wherein the plurality of inputs comprise technical requirements for flexible reserve power.

4. The non-transitory computer readable medium of claim 3 wherein the technical requirements comprise ramp up of power requirement or ramp down of power requirement or time based use of power received from the power grid.

5. The non-transitory computer readable medium of claim 1 wherein the solving of the objective for obtaining flexible reserve power is based on calculating a maxima for least profit derived from providing flexible reserve power in the prediction horizon.

6. The non-transitory computer readable medium of claim 1 wherein the solving of the objective for obtaining flexible reserve power is based on calculating a maxima for aggregated physical flexibility of distributed flexible resources in the prediction horizon.

7. The non-transitory computer readable medium of claim 1 wherein the solving of the objective for obtaining flexible reserve power is based on calculating a self provision of flexible reserve power for use by the plurality of loads that is more economical when compared to purchasing of the flexible reserve power from the power grid.

8. A system for providing flexible reserve power for a power grid, the system comprising:
   a distributed flexible resource comprising a plurality of loads and at least one distributed energy resource;
   a power management unit configured for controlling the distributed flexible resource;
   a dual optimizer unit configured for determining a reserve power schedule for a prediction horizon for providing flexible reserve power to the power grid based on an objective for providing flexible reserve power while maintaining power requirements of the distributed flexible resource; and
   a reserve power unit for providing flexible reserve power to the power grid based on the reserve power schedule.

9. The system of claim 8 wherein the dual optimizer unit is further configured for generating a service bid based on the reserve power schedule.

10. The system of claim 8 wherein the dual optimizer unit further comprises an input unit configured for receiving a plurality of inputs for a plurality of decision parameters for optimizing the objective for providing flexible reserve power.

11. The system of claim 10 wherein the input unit comprises a power pricing module configured for processing pricing data for a given time period, a load profile module configured for processing load profiles for distributed flexible resource for the given time period, an energy cost module for processing energy cost over the given time period, a flexible resource model configured for modelling behavior of the distributed flexible resource over a prediction horizon and a module for transmitting technical requirements for reserve power.

12. The system of claim 11 wherein the dual optimizer unit further comprises a prediction module configured for predicting pricing data, load profile and energy costs over a prediction horizon using respective outputs from the power pricing module, the load profile module and the energy cost module.

13. The system of claim 10 wherein the dual optimizer unit further comprises an optimization module for solving the objective for providing flexible reserve power by processing the plurality of inputs, and configured for generating a dual output, wherein inputs associated with a plurality of loads and distributed energy resources from the plurality of inputs are aggregated as inputs from a distributed flexible resource, and wherein the dual output comprises the schedule for reserve power and a control input for managing the distributed flexible resource.

* * * * *